US012791627B2

(12) United States Patent
Cook et al.

(10) Patent No.: US 12,791,627 B2
(45) Date of Patent: Nov. 10, 2026

(54) MULTIPLE POWER DETECTOR FOR USE IN AMPLIFIERS TO ENHANCE RUGGEDNESS PROTECTION

(71) Applicant: SKYWORKS SOLUTIONS, INC., Irvine, CA (US)

(72) Inventors: Mackenzie Brian Cook, Kanata (CA); Andrew Raymond Chen, Newton, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 158 days.

(21) Appl. No.: 18/792,932

(22) Filed: Aug. 2, 2024

(65) Prior Publication Data

US 2025/0044373 A1 Feb. 6, 2025

Related U.S. Application Data

(60) Provisional application No. 63/530,717, filed on Aug. 4, 2023.

(51) Int. Cl.
*G01R 31/52* (2020.01)

(52) U.S. Cl.
CPC .................................... *G01R 31/52* (2020.01)

(58) Field of Classification Search
CPC ...................................................... G01R 31/52
See application file for complete search history.

(56) References Cited

U.S. PATENT DOCUMENTS

2023/0162937 A1* 5/2023 Telefus ................ G01R 15/202 361/2
2024/0072530 A1* 2/2024 Forejtek ................ H02H 3/087

* cited by examiner

*Primary Examiner* — Benyam Haile
(74) *Attorney, Agent, or Firm* — Lando & Anastasi, LLP

(57) ABSTRACT

A system for fault detection in a circuit. The system includes an input configured to receive an input signal, an output, a reference node, a first detector, and a second detector. The first detector is configured to be in an on state when the second detector is in an off state, and to be in an off state when the second detector is in an on state. A first switching device is coupled between the input and the output and configured allow current to pass from input to output in a first state, and to prevent current from passing from input to output in a second state.

18 Claims, 6 Drawing Sheets

MULTIPLE POWER DETECTOR FOR USE IN AMPLIFIERS TO ENHANCE RUGGEDNESS PROTECTION

CROSS-REFERENCE TO RELATED APPLICATIONS

This application claims priority under 35 U.S.C. § 119(e) to U.S. Provisional Patent Application Ser. No. 63/530,717 titled "MULTIPLE POWER DETECTOR FOR USE IN AMPLIFIERS TO ENHANCE RUGGEDNESS PROTECTION," filed Aug. 4, 2023, the entire contents of which is incorporated herein by reference for all purposes.

BACKGROUND

At least one example in accordance with the present disclosure relates generally to electronic circuit protection.

SUMMARY

According to at least one aspect of the present disclosure, a system for fault detection in a circuit is provided. The system comprises an input configured to receive an input signal, an output, a reference node, a first detector, and a second detector. The first detector is configured to be in an on state when the second detector is in an off state, and to be in an off state when the second detector is in an on state. A first switching device is coupled between the input and the output and configured allow current to pass from input to output in a first state, and to prevent current from passing from input to output in a second state.

In some examples, the circuit is configured to operate in a first mode and a second mode. In some examples, the first switching device operates in the first state in the first mode and the second state in the second mode. In some examples, the system further comprises a filter coupled in series with the first switching device between the input and the output, and an amplifier coupled to the output and coupled in series with the filter between the input and the output. In some examples, the system, further comprises a second switching device coupled to the first switching device at a first connection and to the reference node at a second connection, the second switching device being configured to prevent current from passing from the first connection to the reference node in a first mode and to allow current to pass from the first connection to the reference node in a second mode. In some examples, the second switching device operates in the first mode when the first switching device is in the first state, and operates in the second mode when the first switching device is in the second state. In some examples, the first switching device is coupled between the input and the filter, the first detector is coupled to the input, and the second detector is coupled to the output. In some examples, the first switching device is coupled between the input and the filter, the first detector is coupled between the filter and the amplifier, and the second detector is coupled to the output. In some examples, the first switching device is coupled between the input and the filter, the first detector is coupled to the input, and the second detector is coupled between the filter and the amplifier. In some examples, the system further comprises a third detector coupled to the output. In some examples, the first switching device and the first detector are coupled between the filter and the amplifier, and the second detector is coupled to the output. In some examples, the system further comprises at least one controller configured to control a state of the first switching device, a state of the first detector, and a state of the second detector. In some examples, the first detector is an active detector and the second detector is a passive detector.

According to at least one aspect of the present disclosure, a system for fault detection in a circuit is provided. The system comprises an input, an output, a first detector coupled to the input, a second detector coupled to the output, a first switch coupled to the input, a second switch coupled to the first switch and to a reference node, a filter coupled to the first switch, and an amplifier coupled to the filter and to the output.

According to at least one aspect of the present disclosure, a system for fault detection in a circuit is provided, the system comprising an input; an output; a first detector coupled to the input; a first switch coupled to the input; a second switch coupled to the first switch and to a reference node; a filter coupled to the first switch; a second detector coupled to the filter; and an amplifier coupled to the filter and to the output.

According to at least one aspect of the present disclosure, a system for fault detection in a circuit is provided, the system comprising an input; an output; a first switch coupled to the input; a second switch coupled to the first switch and a reference node; a filter coupled to the first switch; a first detector coupled to the filter; an amplifier coupled to the filter and the output; and a second detector coupled to the output.

In some examples, the system further comprises a third detector coupled to the input.

According to at least one aspect of the present disclosure, a system for fault detection in a circuit is provided, the system comprising an input; an output; a filter coupled to the input; a first detector coupled to the filter; a first switch coupled to the filter; a second switch coupled to the first switch and to a reference node; an amplifier coupled to the first switch and to the output; and a second detector coupled to the output.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
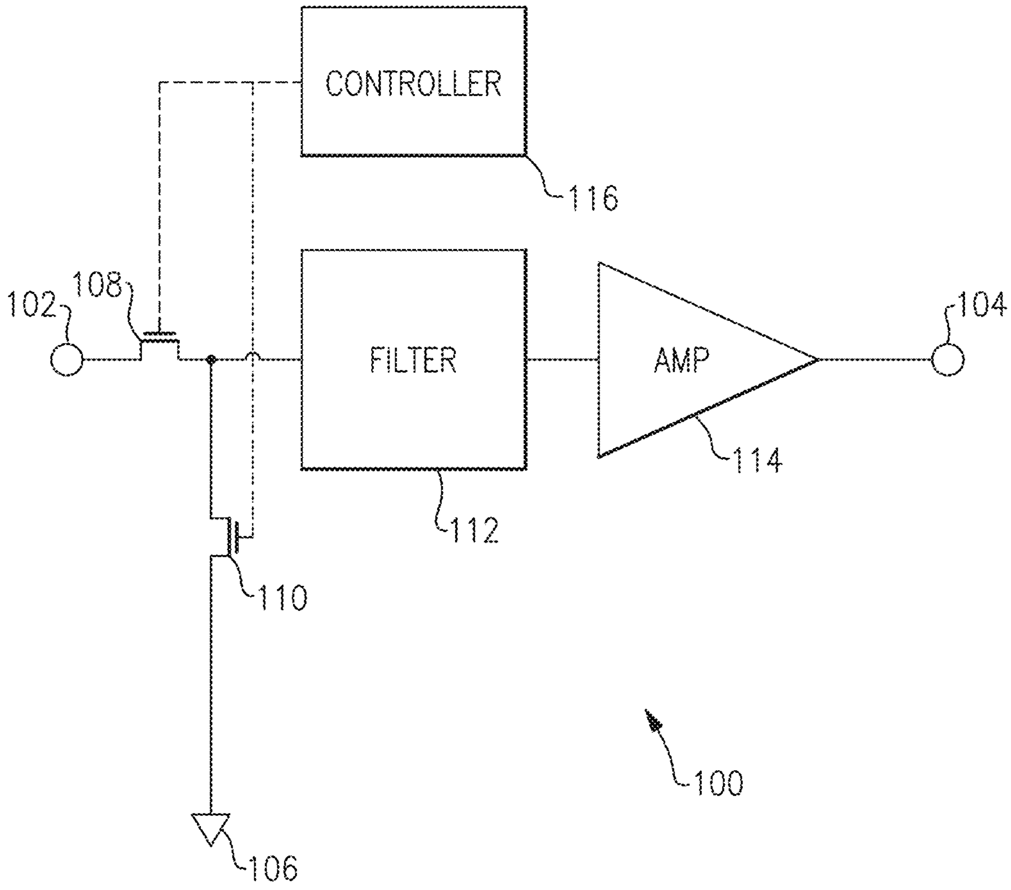
FIG. 1 illustrates a circuit according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Circuits can suffer damage when exposed to overvoltage, overcurrent, or other conditions where the power received by the circuit exceeds a voltage, current, and/or power rating of the circuit. In some circuits, amplifiers may be damaged when an input to the amplifier, such as a voltage or current, exceeds a threshold value.

To prevent undesirable conditions from affecting an amplifier (or other circuit element), ruggedness detectors may be used to monitor conditions in the circuit so that if an undesirable condition occurs, the amplifier (or other circuit element) may be disabled or otherwise shielded from the undesirable conditions.

A ruggedness detector provides a first output when conditions in the circuit are normal, and provides a second output when conditions in the circuit meet a desired criteria. For example, the ruggedness detector may provide the second output when a voltage or current at a given node in the circuit exceeds a threshold value. In some examples, the first output may be logical "0" and the second output may be logical "1." In other examples, the first output may be logical "1" and the second output may be logical "0."

Ruggedness detectors may come in active and passive varieties. A passive ruggedness detector generally does not consume appreciable amounts of power except when active. For example, a passive ruggedness detector may be implemented using passive circuit elements like resistors, diodes, and so forth. Active ruggedness detectors may consume more power than passive ruggedness detectors, and in some examples may consume considerably more power than passive ruggedness detectors. Active ruggedness detectors may be implemented using passive and active circuit components, including transistors and other switching devices. Active ruggedness detectors may be able to detect a broader range of circuit conditions compared to passive ruggedness detectors. For example, a passive ruggedness detector may rely on a diode having a set forward voltage, where the detector activates only if the diode is conducting. Thus, this hypothetical passive ruggedness detector may only detect an undesirable condition if the voltage at the input to the passive ruggedness detector exceeds the forward voltage of the diode. Furthermore, the passive ruggedness detector may not be able to detect when the undesirable condition ends.

By using two ruggedness detectors, it is possible to obtain both the low power benefits of passive ruggedness detectors and the nuance and versatility of active ruggedness detectors while protecting an amplifier (or other circuit element) from undesirable circuit conditions. In particular, placing a passive ruggedness detector at the output of an amplifier, and an active ruggedness detector at the input of the amplifier, and varying which ruggedness detector is enabled may allow a circuit to use the passive ruggedness detector during normal operating conditions and the active ruggedness detector during abnormal circuit conditions, thus realizing power savings during the time the active ruggedness detector is disabled.

FIG. 1 illustrates a circuit 100 according to an example. The circuit 100 includes an input 102, an output 104, a reference node 106, a series switching device 108 (series switch 108), a shunt switching device 110 (shunt switch 110), a filter 112, an amplifier 114, and at least one controller 116 (controller 116).

The input 102 is coupled to the series switch 108. The series switch 108 is coupled to the input 102 at a first connection and to the shunt switch 110 and filter 112 at a second connection. The shunt switch 110 is coupled to the reference node 106 at a first connection and to the series switch 108 and filter 112 at a second connection. The filter 112 is coupled to the series switch 108 and the shunt switch 110 at a first connection and to the amplifier 114 at a second connection. The amplifier 114 is coupled to the filter 112 at a first connection and to the output 104 at a second connection.

The input 102 is configured to receive an input signal that is to be amplified. The input signal may be an analog or digital signal. The input 102 may provide the input signal to the series switch 108.

The series switch 108 is configured to operate as a switch. The series switch 108 may control (e.g., block or unblock) the conducting path between the input 102 and the filter 112 such that no or negligent input current passes through the series switch 108. During an overcurrent, overvoltage, or other fault condition that might damage the circuit 100 and/or amplifier 114, the series switch 108 may switch from a closed (i.e., conducting) state to an open (i.e., non-conducting) state. By switching to an open state, the series switch 108 can protect the filter 112 and/or amplifier 114 from potentially damaging conditions.

The shunt switch 110 is also configured to operate as a switch. The shunt switch 110 may control the conducting path between the reference node 106 and the series switch 108 and/or filter 112. During normal operation of the circuit 100, the shunt switch 110 may be in an open state, such that the reference node 106 is disconnected and/or effectively disconnected from the series switch 108 and filter 112. During a fault condition, the shunt switch 110 may switch to a closed state, such that any current that comes across the series switch 108 may be shunted (that is, redirected) to the reference node 106. Thus, current may pass from the input 102 through the series switch 108 and through the shunt switch 110 to the reference node 106 during fault conditions. In some examples, the shunt switch 110 being in the closed state provides additional protection in the event that the series switch 108 fails to prevent current from passing through during a fault condition.

The filter 112 may filter the input signal. For example, the filter 112 may selectively attenuate various components (in the frequency domain) of the input signal, to remove unwanted noise or frequencies that might cause the amplifier 114 to behave in an unintended manner, or those that are not of interest, and to pass those frequencies that match the passband of the filter. The filter 112 may provide the resulting filtered signal to the amplifier 114.

The amplifier 114 may amplify the filtered signal by applying a level of gain to the filtered signal, and provide the resulting signal as an output signal to the output 104.

Figure 2:
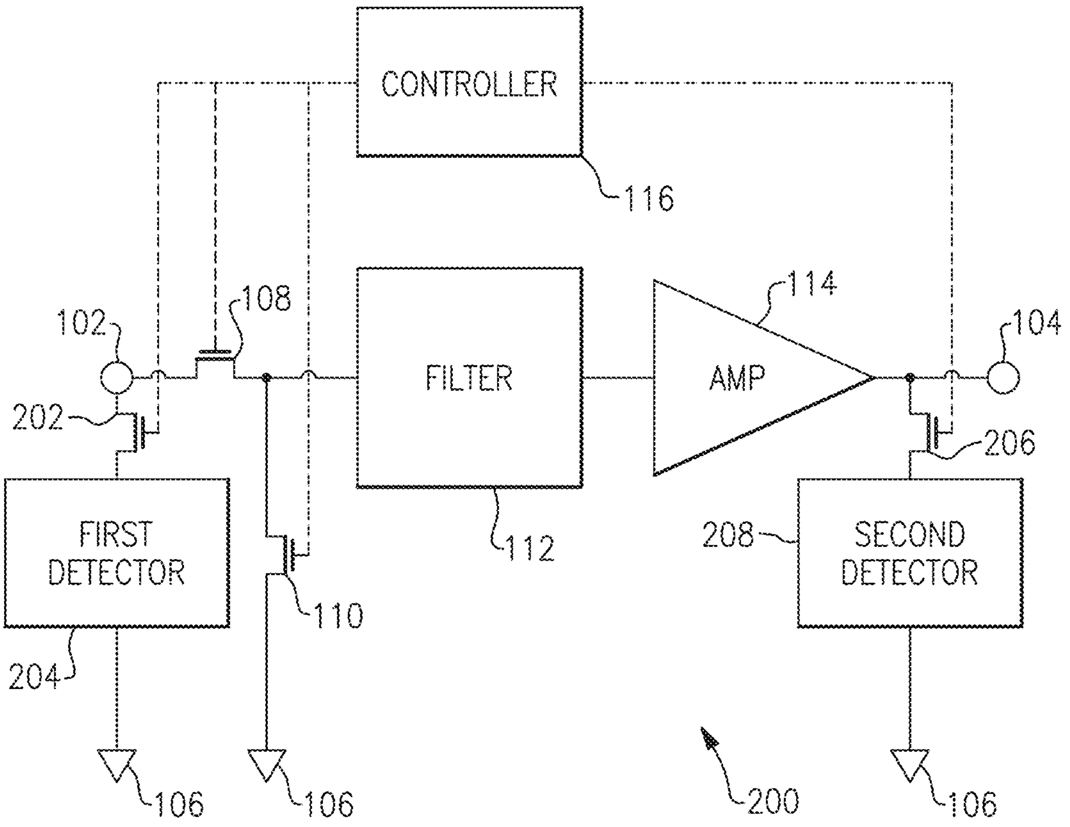
FIG. 2 illustrates a circuit with one or more ruggedness detectors according to an example.
Figure 3:
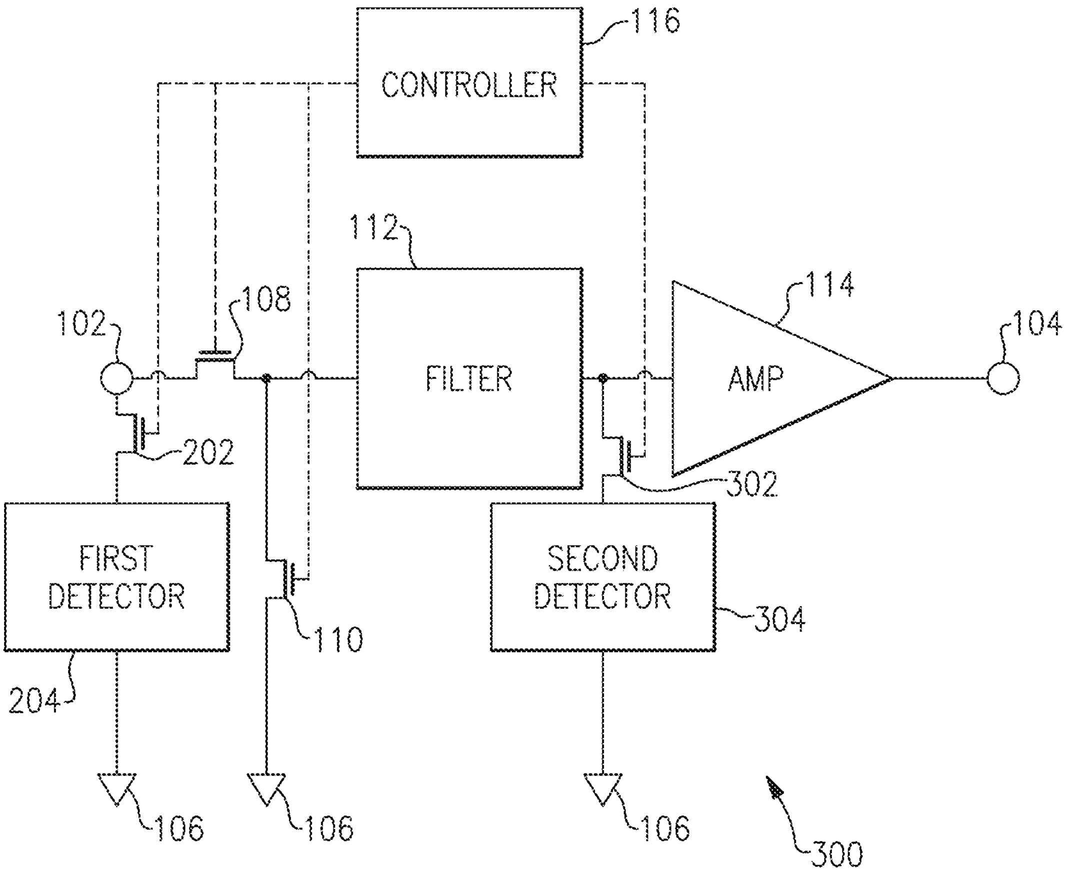
FIG. 3 illustrates a circuit with one or more ruggedness detectors according to an example.
Figure 4:
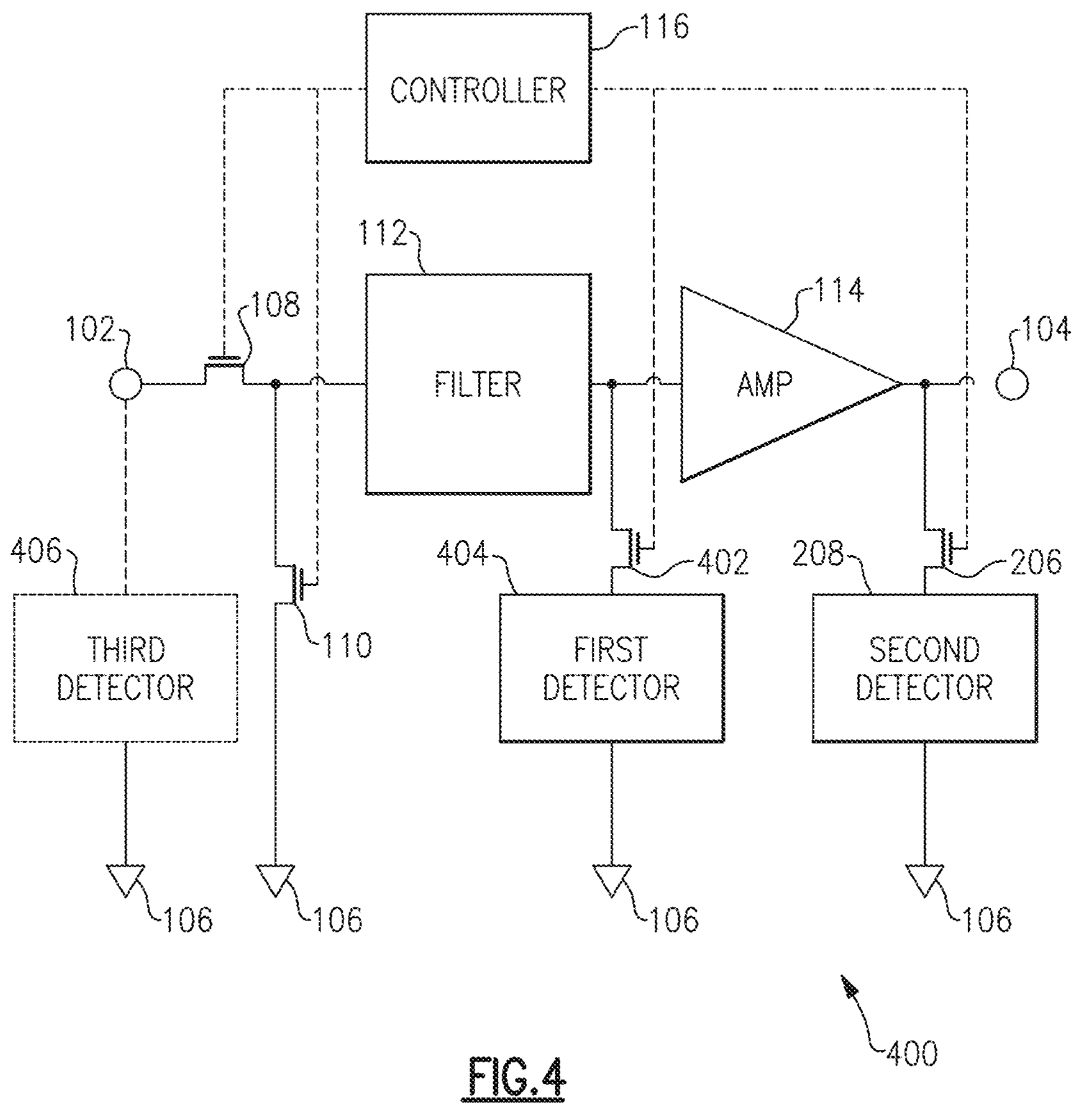
FIG. 4 illustrates a circuit with one or more ruggedness detectors according to an example.

FIGS. 2-4 illustrates various circuit topologies according to various examples. Each of the circuit 200, 300, 400 of FIGS. 2-4 may include the input 102, series switch 108, shunt switch 110, filter 112, amplifier 114, output 104, and reference node 106. However, the placement of other components may vary between the circuits 200, 300, 400.

FIG. 2 illustrates a circuit 200 according to an example. The circuit 200 includes detectors that monitor the condition of the circuit, and can be used to determine when a fault condition begins and when the fault condition ends. The circuit 200 may use a passive detector located downstream of the amplifier (e.g., located closer to the output 104 relative to the amplifier 114) to save power when the amplifier 114 is turned on and/or the circuit 200 is in use. During a fault condition, the circuit 200 can deactivate (as will be described below), and an active upstream detector (e.g., a detector closer to the input 102 relative to the amplifier 114) may be used to detect when the fault condition subsides or ends.

The circuit 200 includes a first switching device 202 (first switch 202), a first detector 204, a second switching device 206 (second switch 206), and a second detector 208. The first switch 202 is coupled to the input 102 at a first connection and to the first detector 204 at a second connection. The first detector 204 is coupled to the first switch 202 at a first connection and the reference node 106 at a second connection. The second switch 206 is coupled between the amplifier 114 and output 104 at a first connection and to the second detector 208 at a second connection. The second detector 208 is coupled to the second switch 206 at a first connection and to the reference node 106 at a second connection.

The first switch 202 controls the operation of the first detector 204. When the first switch 202 is in an open state, the first detector 204 is off with respect to the circuit 200 (that is, the first detector 204 could be used to detect fault conditions for other circuits). When the first switch 202 is in a closed state, the first detector 204 is on.

The second switch 206 controls the operation of the second detector 208. When the second switch 206 is in an open state the second detector 208 is off with respect to the circuit 200, and when the second switch 206 is in a closed state, the second detector 208 is on.

The first detector 204 may be an active device that draws power during operation. The first detector 204 is configured to detect changes in the conditions at the input 102 of the circuit 200. The first detector 204 may be ordinarily off (that is, the first switch 202 may ordinarily be in an open state 202). The first detector 204 may monitor conditions in the circuit upstream (e.g., closer to the input 102) of the amplifier 114 after a fault condition is detected. During times when no fault condition is detected and/or present, the first detector 204 may be disabled (e.g., the first switch 202 may be in an open state). By disabling the first detector 204 during periods of ordinary operation, the circuit 200 may use reduced power compared to constantly using the first detector 204. Instead, the circuit 200 can use the combination of the amplifier 114 and second detector 208 to detect fault conditions. When a fault condition is detected by the second detector 208, and the amplifier 114 is protected and the second detector 208 is off (e.g., because the series switch 108 is open and the shunt switch 110 is closed), the first detector 204 may activate to monitor the circuit 200 and detect when the circuit 200 returns to ordinary operation. While not depicted in FIG. 2, detection signals from the first detector 204 and the second detector 208 can be provided to the controller 116 to alert the controller to a detected fault condition or a return to ordinary operation after a fault condition was detected. The controller 116 may use these detection signals to control operation of the switches 108, 110, 202, and 206. The second detector 208 may be a passive device that does not draw power during 'normal' operation, other than during fault conditions. The second detector 208 is configured to detect changes in the conditions in the circuit 200 that occur during operation. Where the second detector 208 is a passive component, the second detector 208 may not be able to detect the changes in the conditions of the circuit 200 with the same range as the first detector 204. The second detector 208 is located between the amplifier 114 and output 104. As a passive device, the second detector 208 is typically not able to detect small signal values, such as values that may correspond to the input signal provided to the input. However, the amplifier 114 amplifies the input signal (specifically, the filtered input signal), and provides the amplified signal to the output as the output signal. As a result, the second detector 208 may detect minor fluctuations and other conditions at the input 102 of the circuit 200 because any conditions present in the input signal will be amplified by the amplifier 114. The amplifier 114 may amplify the input signal sufficiently such that the second detector 208, even though a passive component, can detect the conditions at the input 102.

In one example, the second detector 208 may be a diode or other circuit element (or set of elements) that require a minimum voltage drop across the element to conduct. When the diode or other element begins to conduct, the second detector 208 may provide a detection signal to a controller or other logic circuitry in the circuit 200 indicating a fault condition. Therefore, in this example, when the voltage at the output 104 rises high enough to cause the second detector 208 to conduct, this may indicate or may be considered to indicate a fault condition.

In one example of operation of the circuit 200, the circuit 200 is operating in a first mode of operation. In the first mode of operation, no fault condition has been detected. As a result, the series switch 108 is closed and the shunt switch 110 is open, the first switch 202 is open, and the second switch 206 is closed. Input signals received at the input 102 proceed to the filter 112, through the amplifier 114, and to the output 104 and the second detector 208. At some point during operation, a fault condition may be detected. The fault condition may be detected because an amplified signal provided at the output of the amplifier 114 to the output 104 and the second detector 208 has a voltage higher than a threshold voltage to trigger the second detector 208. The circuit 200 may switch to a second mode of operation. In the second mode of operation, the series switch 108 is open and the shunt switch 110 is closed, the second switch 206 may be open, and the first switch 202 may be closed as a result of the second detector 208 detecting the fault condition and the controller opening the second switch 206. Input signals received at the input 102 may be provided to the first detector 204. The first detector 204 may compare the input signals to one or more thresholds (such as threshold voltage, current, or other characteristics). Once the first detector 204 detects that the fault condition has ended, the circuit 200 may return to the first mode of operation based on the controller 116 providing control signals to the first switch 202, the second switch 206, the series switch 108, and the shunt switch 110.

FIG. 3 illustrates a circuit 300 according to an example. The circuit 300 includes the first switch 202, the first detector 204, a second switching device 302 (second switch 302), and a second detector 304. There are two main differences between FIG. 3 and FIG. 2. First, the second detector 304 in FIG. 3 is coupled in series with the second switch 302 between the filter 112 and the amplifier 114, rather than being coupled at the output of the amplifier 114 like the second switch 208 of FIG. 2 was coupled. In some examples, the second switch 302 is coupled between the filter 112 and amplifier 114 at a first connection, and to the second detector 304 at a second connection, and the second detector 304 is further coupled to the reference node 106. Second, the second detector 304 is an active detector rather than a passive detector.

When a fault condition occurs in the circuit, the first detector 204 may detect the fault condition, however the fault condition may only exist with respect to frequency components that the filter 112 will attenuate or remove, such that the fault condition would not affect or exist at the output of the filter 112 where the filter 112 couples to the amplifier 114. If the first detector 204 were the only detector, the circuit 300 would switch off (e.g., open the series switch 108 and close the shunt switch 110) even though the amplifier 114 might not be damaged, as the signal might be greatly attenuated by the filter 112. The second detector 304 accounts for this possibility by detecting the filtered output from the filter 112, and thus may only register a fault condition if the fault condition exists in the frequency components of the input signal that reach the amplifier 114. Furthermore, if a fault condition does exist and would affect the amplifier 114, should the fault condition end only with respect to the frequency components of the input signal that reach the amplifier 114, then the second detector 304 may detect the end of the fault condition and the circuit 300 may reactivate. Thus, the positioning of the active second detector 304 between the filter 112 and amplifier 114 allows the circuit to remain active during fault conditions when the fault condition does not affect the amplifier 114 due to filtering by the filter 112.

FIG. 4 illustrates a circuit 400 according to an example. The circuit 400 includes a first switch 402 coupled at a first connection to the filter 112 and the amplifier 114, and coupled at a second connection to a first detector 404. The first detector 404, in turn, is coupled to the reference node 106. The first detector 404 may, in some examples, be an active detector.

In the circuit 400, the first detector 404 may detect the components of the input signal that are not filtered by the filter 112. As a result, the first detector 404 may detect fault conditions that are present in the components of the input signal that are not attenuated by the filter 112. Thus, the first detector 404 may not send a positive indication of a fault condition when the fault condition exists only in the components of the input signal that are not passed through the filter 112 to the amplifier 114. However, because the series switch 108 is coupled between the input 102 and filter 112, when the series switch 108 is in an open state neither the first detector 404 nor the second detector 208 may detect any appreciable portion of the input signal. As a result, an additional or optional detector may be needed upstream (that is, closer to the input 102) of the series switch 108.

Optional detector 406 is coupled to the input 102 at a first connection and to the reference node 106 at a second connection. Optional detector 406 may be configured to be in an on state when the series switch 108 is in an open state. While on, the optional detector 406 may draw power (if it is an active detector, which it may be), and may monitor the circuit 400 for an end of the fault condition. When the series switch 108 is in a closed state, the optional detector 406 may be off and may not draw power.

Figure 5:
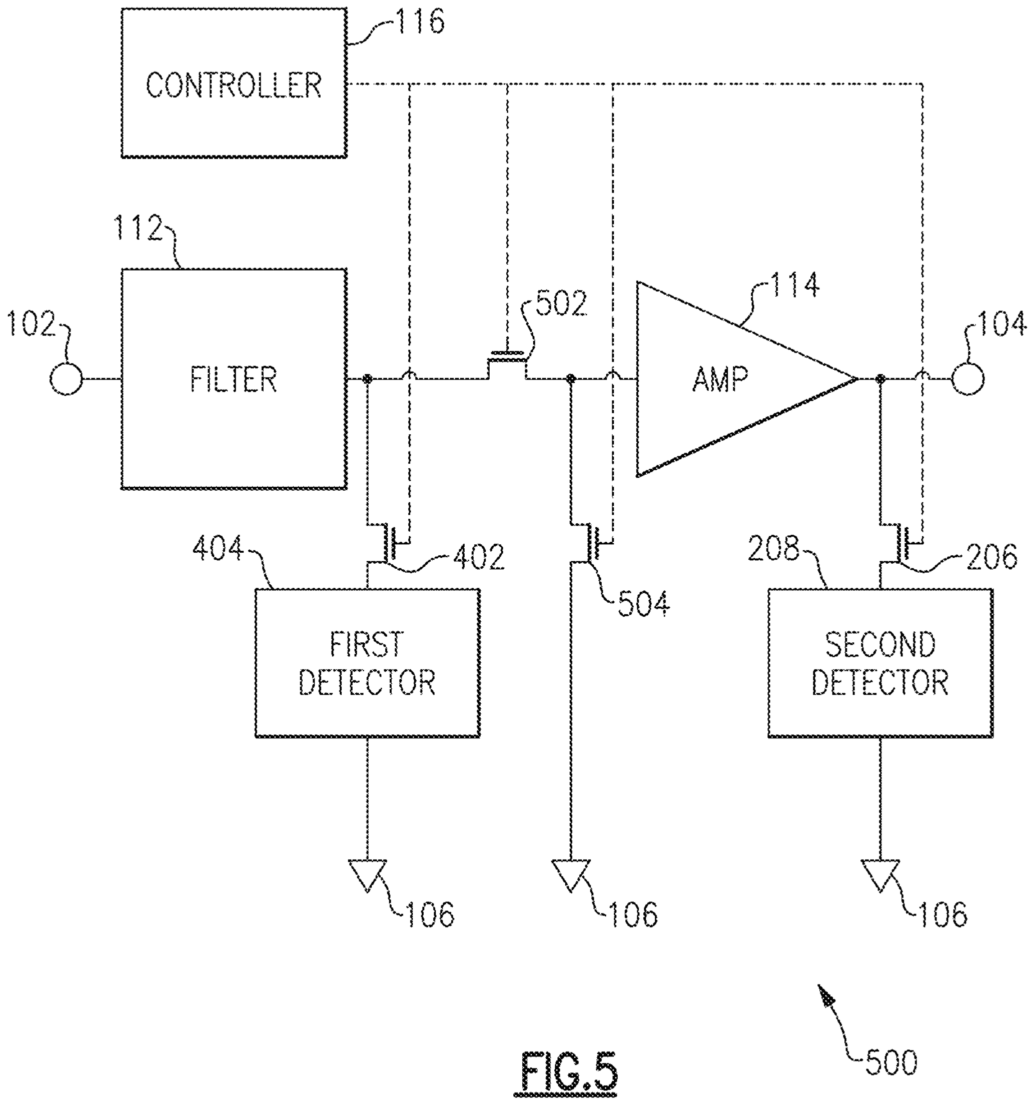
FIG. 5 illustrates a circuit with one or more ruggedness detectors according to an example.

FIG. 5 illustrates a circuit 500 according to an example. The circuit 500 includes a series switching device 502 (series switch 502) and a shunt switching device 504 (shunt switch 504). The input 102 is coupled to the filter 112. The filter 112 is coupled at a first connection to the input 102 and at a second connection to the first switch 402 and series switch 502. The series switch 502 is coupled at a first connection to the filter 112 and the first switch 402, and to the amplifier 114 and shunt switch 504 at a second connection. The first switch 402 is further coupled to the first detector 404, which is coupled to the reference node 106. The shunt switch 504 is coupled to the reference node 106 as well. The amplifier 114 is coupled to the series switch 502 and shunt switch 504 at a first connection, and to the output 104 and second switch 206 at a second connection. The second switch 206 is coupled to the second detector 208. The second detector 208 is further coupled to the reference node 106.

In contrast to the circuit 400 of FIG. 4, the circuit 500 of FIG. 5 has the series switch 502 and shunt switch 504 coupled between the filter 112 and the amplifier 114. This allows for a filtered signal to be provided to the first detector 404 regardless of whether the series switch 502 is open or closed.

As with the other circuits 100, 200, 300, 400, the circuit 500 may operate in two modes of operation. In the first mode of operation, the series switch 502 is closed and the shunt switch 504 is open, the first switch 402 is open, and the second switch 206 is closed. When an input signal arrives at the input 102, the signal is provided to the filter 112. The filter 112 filters the signal, removing or attenuating unwanted components of the input signal. The filter 112 provides the filtered input signal to the series switch 502 and first switch 402. Because the first switch 402 is open, the input signal does not reach the first detector 404. Instead, the input signal passes through the series switch 502 to the amplifier 114 and shunt switch 504. Because the shunt switch 504 is open, the input signal is not diverted to the reference node 106. Instead, the amplifier 114 amplifies, attenuates, or otherwise modifies the input signal and provides the modified input signal as an output signal to the output 104 and the second switch 206. The second switch 206 may be closed, thus the output signal may be provided to the second detector 208 which may be a passive detector. If the second detector 208 detects a fault condition, the second detector 208 may provide a signal to the controller 116 indicating the existence of a fault condition. The controller 116 can then switch the circuit 500 to a second mode of operation.

In the second mode of operation, the series switch 502 is open, the shunt switch 504 is closed, the second switch 206 is open, and the first switch 402 is closed. As a result, the input signal now arrives at the input 102, is provided to the filter 112 and filtered, before being provided to the series switch 502 and first switch 402. Because the series switch 502 is open, little to no current may be provided to the amplifier 114 and/or shunt switch 504. Because the shunt switch 504 is closed, any current that is provided to the amplifier 114 and/or shunt switch 504 may be diverted to the reference node 106. Because the first switch 402 is closed, the input signal is provided to the first detector 404, which may be an active detector, and which may monitor to detect an end of the fault condition. Once the fault condition ends, the first detector 404 may provide a signal to the controller 116 indicating the end of the fault condition.

In FIG. 5, the filter 112 being coupled directly to the input 102 provides for only filtered input signals reaching the detectors 404, 208. Thus, in FIG. 5, the circuit 500 may detect only fault conditions that exist within at least the frequency components of the input signal that are provided to the amplifier 114. The presence of the series switch 502 and shunt switch 504 after the branch of the circuit leading to the first detector 404 allows the first detector 404 to continue monitoring for fault conditions even after the series switch 502 switches to an open state.

Figure 6:
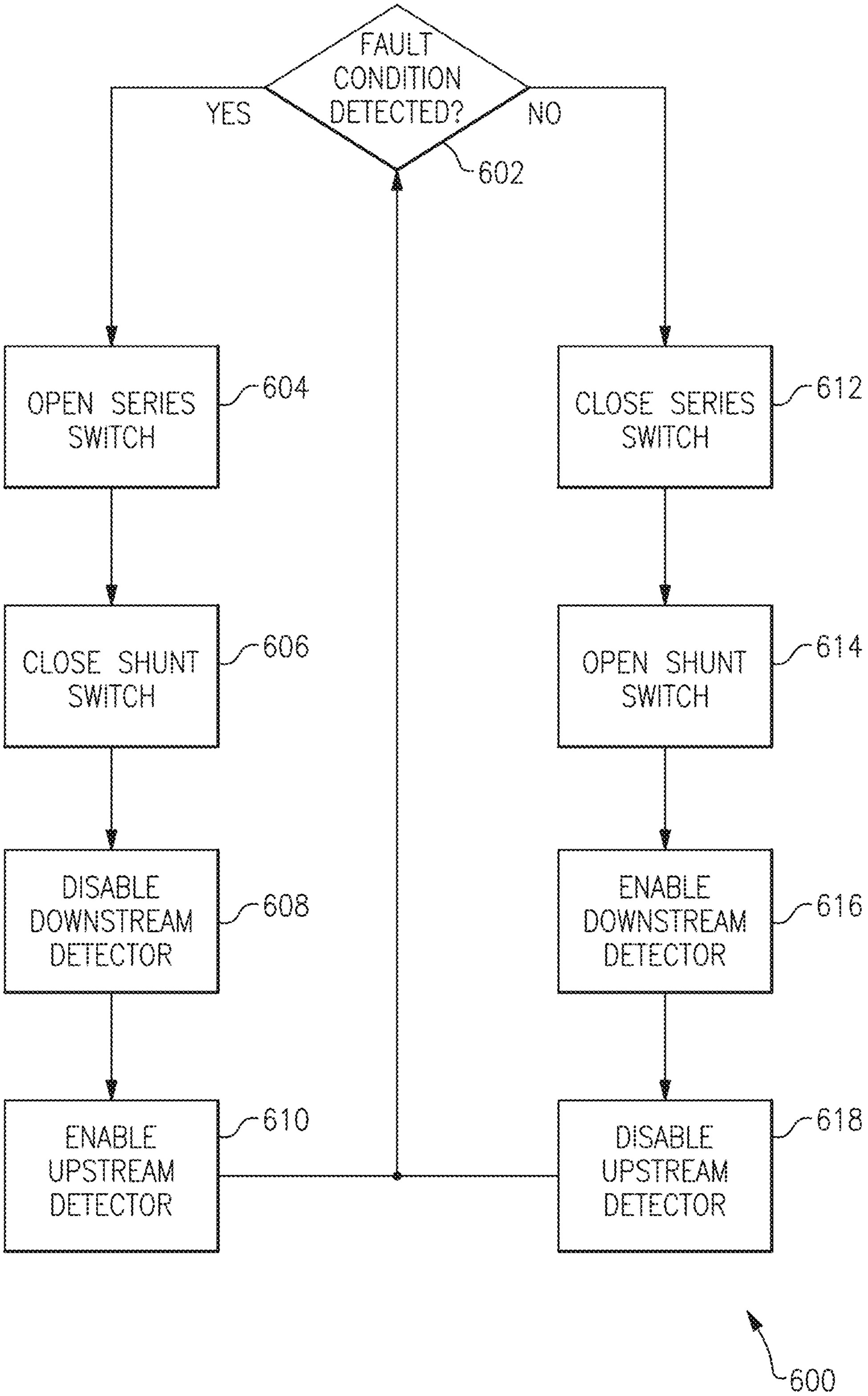
FIG. 6 illustrates a process involving one or more ruggedness detectors according to an example.

FIG. 6 illustrates a process 600 for protecting a circuit element from fault conditions according to an example. The process 600 monitors the circuit for the presence or absence of a fault condition that might affect the protected circuit element, and then adjusts various switches and detectors to protect the protected circuit element from the fault condition.

At act 602, the controller 116 determines whether a fault condition exists in the circuit. The controller 116 may determine whether a fault condition exists based on the outputs of one or more detectors configured to detect the presence of a fault condition. If a fault condition exists or is detected, the process 600 proceeds to act 604. If a fault condition does not exist or is not detected, the process 600 continues to act 612.

At act 604, the controller 116 controls the series switch (e.g., series switch 108, 502) to be in an open state, whereby the series switch does not provide a conducting path for an appreciable amount of current between an input and an output. If the series switch is a transistor, for example, the controller 116 may control the voltage at the gate of the series switch such that the series switch is off. The process 600 then continues to act 606.

At act 606, the controller 116 controls the shunt switch (e.g., shunt switch 110, 504) to be in a closed state, whereby the shunt switch provides a conducting path for an appreciable amount of current between the series switch and a reference node. If the shunt switch is a transistor, for example, the controller 116 may control the voltage at the gate of the shunt switch such that the shunt switch is off. The process 600 then continues to act 608.

At act 608, the controller 116 disables the downstream detector. The downstream detector may be a detector that is coupled nearest to the output (e.g., the second detector 208, 304). The controller 116 may disable the downstream detector such that the downstream detector cannot or will not detect the presence or absence of a fault condition in the circuit. In some examples, the downstream detector may be coupled to a transistor or other switching device that controls the state of the downstream detector, and the controller 116 may control the transistor or switching device to be in a state that renders the downstream detector disabled. The process 608 then continues to act 610.

At act 610, the controller 116 enables the upstream detector. The upstream detector may be a detector that is coupled nearest to the input (e.g., the first detector 204, 404). The controller 116 may enable the upstream detector such that the upstream detector can or will detect the presence or absence of a fault condition in the circuit. In some examples, the upstream detector may be coupled to a transistor or other switching device that controls the state of the upstream detector. The controller 116 may control the transistor or other switching device to be in a state that renders the upstream detector enabled. The process 600 may then return to act 602.

At act 612, the controller 116 controls the series switch to be in a closed state. The process 600 may then continue to act 614.

At act 614, the controller 116 controls the shunt switch to be in an open state. The process 600 may then continue to act 616.

At act 616, the controller 116 enables the downstream detector. The process 600 may then continue to act 618.

At act 618, the controller 116 disables the upstream detector. The process 600 may then return to act 602.

The controller 116 shown in FIGS. 1-5 may be coupled to the control mechanism of each switch (e.g., the series switch 108, 502 shunt switch 110, 504, first switch 202, 402, second switch 206, 302, and so forth). In some examples, the controller 116 may be coupled to a gate of the switching devices (such as when the switching devices are implemented using transistors) and may be configured to provide a voltage to the gate to control whether the switching devices conduct appreciable current or do not.

The controller 116 may be configured to determine the state of each switch based on outputs provided by the detectors 204, 208, 304, 404. For example, the controller 116 may contain logic circuitry that causes the controller 116 to operate the switches to prevent the input signal from reaching the amplifier 114 responsive to determining that a fault condition exists in the circuit and/or in the frequency components passed by the filter 112 from the input 102 to the amplifier 114. Likewise, the controller 116 may contain logic circuitry that causes the controller 116 to operate the switches to allow the input signal to reach the amplifier 114 responsive to determining that no fault condition exists in the circuit and/or in the frequency components passed by the filter 112 from the input 102 to the amplifier 114.

In the foregoing, the detectors are generally described as providing a signal to the controller 116 indicative of the fault condition or the end of the fault condition. However, the detectors may also be configured to remove a signal indicative of a fault condition or lack thereof. That is, while actively providing a signal is one possibility to indicate the presence of a fault condition, another possibility is removing an active signal to indicate the presence of a fault condition (that is, the detectors may be normally on or normally off with respect to outputs indicating the presence of fault conditions).

In the foregoing, the amplifier 114 is the circuit element being protected. However, in some examples, the amplifier 114 may be replaced with another circuit element or combination of circuit elements. In general, the fault condition and protection methods and systems disclosed herein may be applied to protect any circuit element or component.

Various controllers, such as the controller 116, may execute various operations discussed above. Using data stored in associated memory and/or storage, the controller 116 also executes one or more instructions stored on one or more non-transitory computer-readable media, which the controller 116 may include and/or be coupled to, that may result in manipulated data. In some examples, the controller 116 may include one or more processors or other types of controllers. In one example, the controller 116 is or includes at least one processor. In another example, the controller 116 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A system for fault detection in a circuit, the system comprising:

an input configured to receive an input signal;

an output;

a reference node;

an amplifier coupled to the output and coupled in series with a filter between the input and the output;

a first detector and a second detector, the first detector configured to be in an on state when the second detector is in an off state, and to be in an off state when the second detector is in an on state; and a first switching device coupled between the input and the output and configured allow at least some current to pass from input to output in a first state, and to prevent at least some current from passing from input to output in a second state, the first switching device and the first detector being further coupled between the filter and the amplifier, and the second detector being coupled to the output, and the filter coupled in series with the first switching device between the input and the output.

2. The system of claim 1 wherein circuit is configured to operate in a first mode and a second mode.

3. The system of claim 2 wherein the first switching device operates in the first state in the first mode and the second state in the second mode.

4. The system of claim 1 further comprising a second switching device coupled to the first switching device at a first connection and to the reference node at a second connection, the second switching device being configured to prevent current from passing from the first connection to the reference node in a first mode and to allow current to pass from the first connection to the reference node in a second mode.

5. The system of claim 4 wherein the second switching device operates in the first mode when the first switching device is in the first state, and operates in the second mode when the first switching device is in the second state.

6. The system of claim 1 wherein the first switching device is coupled between the input and the filter, the first detector is coupled to the input, and the second detector is coupled to the output.

7. The system of claim 6 wherein the first detector is an active detector and the second detector is a passive detector.

8. The system of claim 1 wherein the first switching device is coupled between the input and the filter, the first detector is coupled between the filter and the amplifier, and the second detector is coupled to the output.

9. The system of claim 8 wherein the first detector is an active detector and the second detector is a passive detector.

10. The system of claim 1 wherein the first switching device is coupled between the input and the filter, the first detector is coupled to the input, and the second detector is coupled between the filter and the amplifier.

11. The system of claim 10 wherein the first detector is an active detector and the second detector is a passive detector.

12. The system of claim 10 further comprising a third detector coupled to the output.

13. The system of claim 1 wherein the first detector is a passive detector and the second detector is an active detector.

14. The system of claim 1 further comprising at least one controller configured to control a state of the first switching device, a state of the first detector, and a state of the second detector.

15. The system of claim 1 wherein the first detector is an active detector and the second detector is a passive detector.

16. A system for fault detection in a circuit, the system comprising:

an input;

an output;

an amplifier coupled between the input and the output;

a first detector coupled between an input of the amplifier and a reference node;

a second detector coupled between an output of the amplifier and the reference node;

a first switch coupled to the input;

a second switch coupled to the first switch and to the reference node; and a filter coupled to the first switch and to the amplifier.

17. A system for fault detection in a circuit, the system comprising:

an input;

an output;

an amplifier coupled between the input and the output;

a first detector coupled between an input of the amplifier and a reference node;

a first switch coupled to the input;

a second switch coupled to the first switch and to the reference node;

a filter coupled to the first switch;

a second detector coupled between an output of the amplifier and the reference node; and an amplifier coupled to the filter and to the output.

18. The system of claim 17 wherein the first detector is an active component and the second detector is a passive component.

* * * * *